United States Patent
Tan et al.

(10) Patent No.: US 7,633,347 B2
(45) Date of Patent: Dec. 15, 2009

(54) APPARATUS AND METHOD FOR OPERATING A PHASE-LOCKED LOOP CIRCUIT

(75) Inventors: Seeteck Tan, Singapore (SG); Meng Chu, Singapore (SG)

(73) Assignee: 02Micro International Limited, Grand Cayman (KY)

( * ) Notice: Subject to any disclaimer, the term of this patent is extended or adjusted under 35 U.S.C. 154(b) by 171 days.

(21) Appl. No.: 11/809,044

(22) Filed: May 30, 2007

(65) Prior Publication Data

US 2008/0218277 A1 Sep. 11, 2008

Related U.S. Application Data

(60) Provisional application No. 60/906,144, filed on Mar. 8, 2007.

(51) Int. Cl.
*H03L 7/00* (2006.01)
(52) U.S. Cl. .............................. 331/16; 331/17; 331/25; 331/57
(58) Field of Classification Search .................. 331/17, 331/25, 57, 175
See application file for complete search history.

(56) References Cited

U.S. PATENT DOCUMENTS

| | | | |
|---|---|---|---|
| 5,144,156 A | 9/1992 | Kawasaki | 307/262 |
| 5,362,990 A | 11/1994 | Alvarez et al. | 327/538 |
| 5,631,587 A * | 5/1997 | Co et al. | 327/107 |
| 6,462,623 B1 * | 10/2002 | Horan et al. | 331/17 |
| 7,126,434 B2 * | 10/2006 | Lee | 331/176 |
| 7,218,168 B1 * | 5/2007 | Rahman | 327/540 |
| 2002/0135428 A1 * | 9/2002 | Gomez | 331/17 |
| 2002/0191728 A1 * | 12/2002 | Hafez et al. | 375/376 |
| 2003/0210099 A1 * | 11/2003 | Ingino, Jr. | 331/57 |
| 2004/0095188 A1 * | 5/2004 | Puma et al. | 327/543 |
| 2006/0006929 A1 * | 1/2006 | Caplan et al. | 327/546 |
| 2006/0119441 A1 | 6/2006 | Azam et al. | 331/16 |
| 2007/0279141 A1 * | 12/2007 | Chui | 331/158 |
| 2008/0136396 A1 * | 6/2008 | Heilmann | 323/298 |
| 2008/0191795 A1 * | 8/2008 | Dharmalinggam et al. | 327/553 |

OTHER PUBLICATIONS

Extended European Search Report received in European Application No. 07015328.3 dated Aug. 13, 2008 (10 pages).

* cited by examiner

*Primary Examiner*—Joseph Chang
*Assistant Examiner*—Jeffrey Shin

(57) ABSTRACT

An apparatus and method for operating a phase-locked loop circuit are disclosed. The phase locked loop circuit includes a plurality of resistive elements and a plurality of capacitive elements that are distributed in a charge pump, a loop filter and a voltage controlled oscillator. The plurality of resistive elements have a plurality of resistances that vary in proportion to each other. The plurality of capacitive elements have a plurality of capacitive elements that vary in proportion to each other. A damping factor of the phase-locked loop circuit is maintained substantially constant by the plurality of resistive elements and the plurality of capacitive elements.

34 Claims, 12 Drawing Sheets

APPARATUS AND METHOD FOR OPERATING A PHASE-LOCKED LOOP CIRCUIT

RELATED APPLICATION

This application claims priority to U.S. Provisional Application No. 60/906,144, filed on Mar. 8, 2007, the specification of which is hereby incorporated in its entirety by reference.

BACKGROUND

1. Field of the Invention

The present invention relates to phase-locked loop (PLL) circuits.

2. Description of the Related Art

PLL circuits are widely used in many applications. Application examples include clock and data recovery, clock synthesis, frequency synthesis, modulator and de-modulator. Generally, a PLL circuit is employed to provide an output clock which follows an input clock closely.

A conventional PLL circuit 100 as shown in FIG. 1 includes a phase frequency detector (PFD) 103, a charge pump 105, a loop filter 107, a voltage controlled oscillator (VCO) 109 and a frequency divider 111. The frequency divider 111 generates a feedback clock 102 by dividing an output clock $F_{VCO}$ by a divider factor N. The PFD 103 detects a phase difference between a reference clock $F_{ref}$ 101 and the feedback clock 102. Depending on whether the reference clock $F_{ref}$ 101 leads or lags the feedback clock 102, the charge pump 105 generates a charge pump current $I_{cp}$ to deliver either positive or negative charge pulses to the loop filter 107. These charge pulses are integrated by the loop filter 107 to generate an oscillator control voltage $V_{ctrl}$. The oscillator control voltage $V_{ctrl}$ moves the output clock $F_{VCO}$ of the VCO 109 up or down until the phases of the reference clock $F_{ref}$ 101 and the feedback clock 102 are synchronized. The loop filter 107 may further include a loop resistor 113 and a loop capacitor 115 coupled in series. The divider factor N is determined by a desired frequency of the output clock $F_{VCO}$. With a constant divider factor N, the PLL circuit 100 can force the output clock $F_{VCO}$ to be exactly N times the reference clock $F_{ref}$ 101.

A damping factor δ and a natural frequency $\omega_n$ of the PLL circuit 100 are given by the following equations:

$$\delta = \frac{R_p}{2}\sqrt{\frac{I_{cp}K_{VCO}C_p}{2\pi N}} \quad (1)$$

$$\omega_n = \sqrt{\frac{I_{cp}K_{VCO}}{2\pi C_p N}} \quad (2)$$

where $K_{VCO}$ is a tuning sensitivity of the VCO 109 in radian/volt, $I_{cp}$ is the charge pump current, N is the divider factor, $R_p$ is the resistance of the filter resistor 113 and $C_p$ is the capacitance of the filter capacitor 115.

The natural frequency $\omega_n$ indicates response quality of the PLL circuit 100. The damping factor δ can be used to examine transient quality of the PLL circuit 100. If an improper damping factor δ is used, circuit vibrations don't damp out and the PLL circuit 100 becomes unstable. Generally, smaller damping factors give better rejection but larger transients. Larger damping factors have better behaved frequency response but they are sluggish in acquisition time response. The optimum damping factor δ is 0.707 which is often designed as the target value of a good compromise between acquisition time response and frequency response.

Referring to the equations (1) and (2), it can be observed that the damping factor δ and the natural frequency $\omega_n$ of the PLL 100 are dependent on physical elements, such as resistors, capacitors, currents, etc., which have significant variations over manufacturing process and operation environments. Moreover, in order to save the use of discrete components, the filter resistor 113 and the filter capacitor 115 may be implemented on-chip. However, during the integrated circuit fabrication, all of these PLL parameters will vary in a certain range and performance of the PLL circuit 100 will be impacted if variations in these PLL parameters exceed specified limits and tolerances. For example, on-chip resistance and capacitance variations over the worst case process corners may be as large as ±25%. Hence, the damping factor δ and the natural frequency $\omega_n$ cannot be kept constant as the designed value irrespectively of manufacturing process and operation environments. Similarly, other critical PLL specifications, such as loop bandwidth, phase noise, switching transient and loop stability, will also deviate from the designed values. For example, the damping factor δ is intrinsically related to the stability and phase margin of the PLL circuit. Also, the loop bandwidth is a function of the damping factor δ. Many applications require a constant loop bandwidth over the entire output frequency range, and the optimum loop bandwidth should be larger than the largest baseband spectral frequency.

SUMMARY

Embodiments in accordance with the present invention provide a phase-locked loop circuit. The phase locked loop circuit includes a plurality of resistive elements and a plurality of capacitive elements that are distributed in a charge pump, a loop filter and a voltage controlled oscillator. The charge pump provides a charge pump current. The loop filter produces an oscillator control voltage based on the charge pump current. The voltage controlled oscillator generates an output clock under control of the oscillator control voltage. The plurality of resistive elements further have a plurality of resistances that vary in proportion to each other. The plurality of capacitive elements further have a plurality of capacitive elements that vary in proportion to each other. A damping factor of the phase-locked loop circuit is maintained substantially constant by the plurality of resistive elements and the plurality of capacitive elements.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Reference will now be made in detail to embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
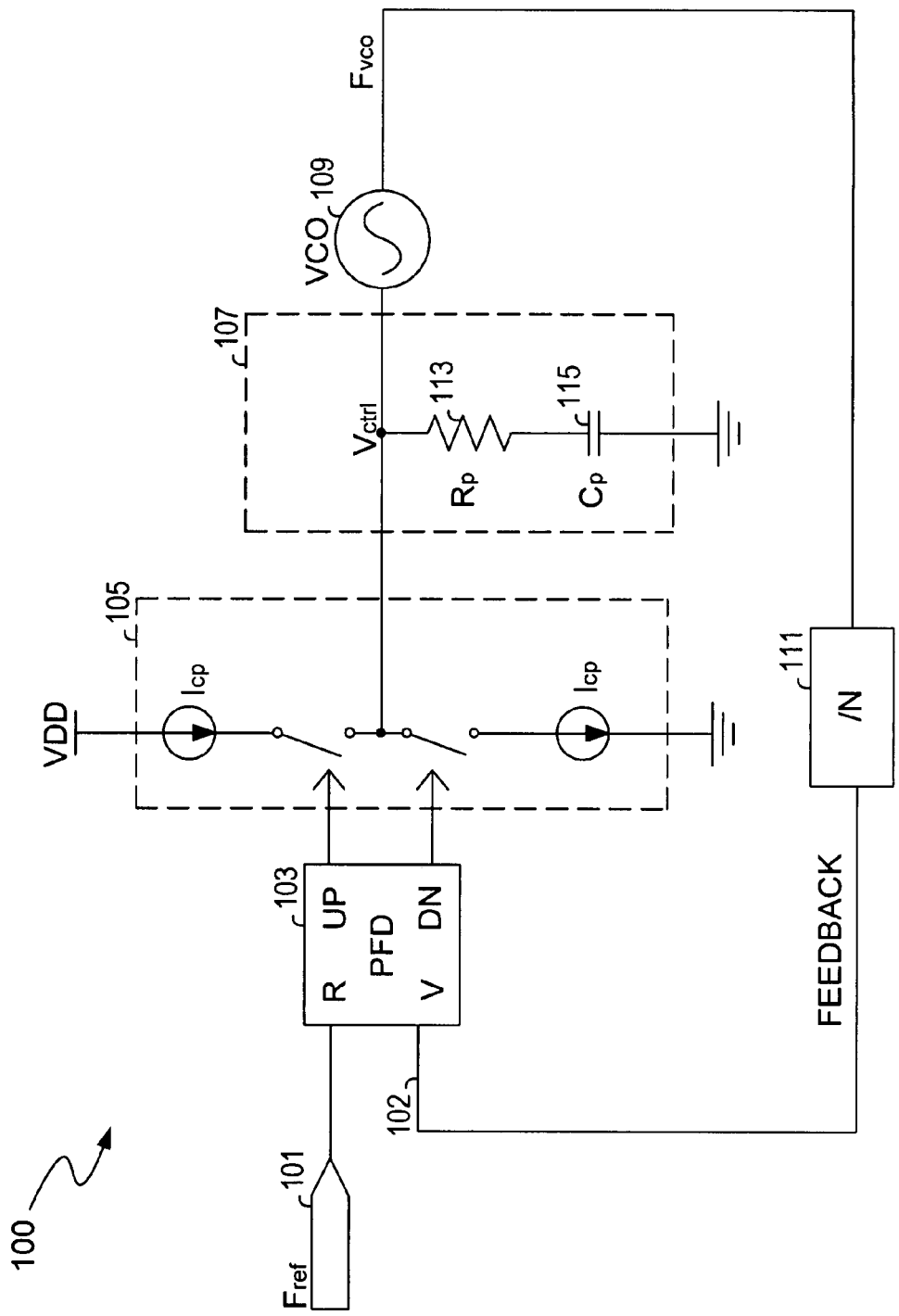
FIG. 1 is a block diagram of a conventional PLL circuit.
Figure 2:
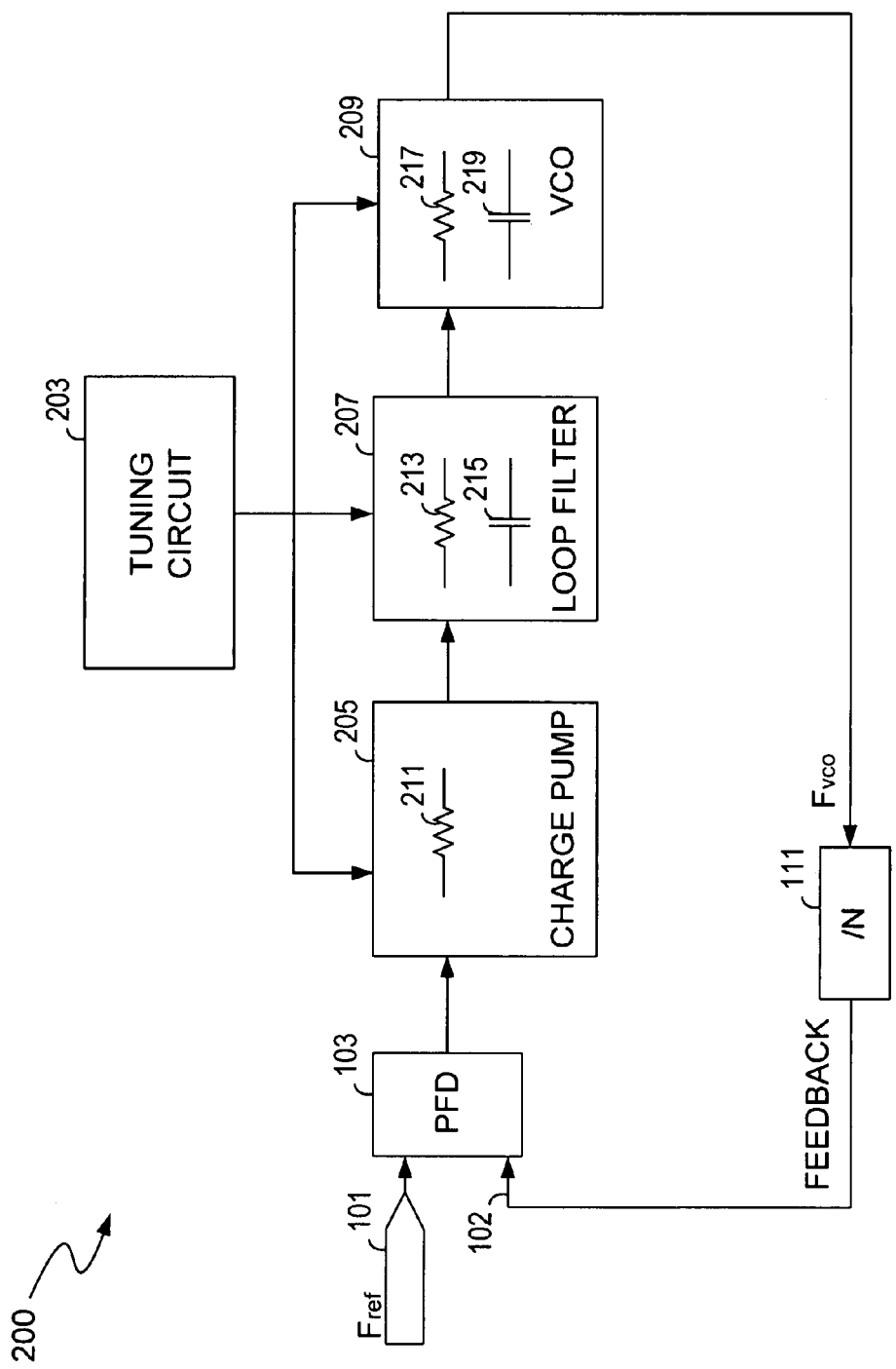
FIG. 2 is a block diagram of a PLL circuit according to one embodiment of the present invention.

FIG. 2 illustrates a block diagram of a PLL circuit 200 according to one embodiment of the present invention. Elements labeled the same in FIG. 1 have similar functions and will not be repetitively described herein for purposes of brevity and clarity. The PLL circuit 200 includes a loop path within it. The loop path further includes a plurality of resistive elements and a plurality of capacitive elements respectively distributed in resistor sections and capacitor sections of a charge pump 205, a loop filter 207 and a VCO 209. For example, the charge pump 205 may include a charge resistor section 211, the loop filter 207 may include a filter resistor section 213 and a filter capacitor section 215, and the VCO 209 may include an oscillator resistor section 217 and an oscillator capacitor section 219. When the plurality of resistive elements are of the same type or material, the resistances of the plurality of resistive elements will vary in proportion to each other and consequently resistance ratios between any two resistive elements will be maintained substantially constant irrespectively of manufacturing process and operation environments. As used herein, the term "substantially constant damping factor" means that the damping factor can vary but remains within a range such that the output clock $F_{VCO}$ can be locked in a desired settling time, which is partly determined by the designed damping factor, e.g., 0.707. Similarly, when the plurality of capacitive elements are of the same type or material, the capacitances of the plurality of capacitive elements will vary in proportion to each other and consequently capacitance ratios between any two capacitive elements will be maintained substantially constant irrespectively of manufacturing process and operation environments. As used herein, the term "substantially constant natural frequency" means that the natural frequency can vary but remains within a range such that the output clock $F_{VCO}$ can be locked in a desired settling time, which is partly determined by the designed natural frequency.

Moreover, the damping factor δ of the PLL circuit 200 is a function of the resistance ratios and capacitance ratios, and thus is in turn maintained substantially constant to allow a stable performance of the PLL circuit 200 irrespectively of manufacturing process and operation environments. Furthermore, to achieve stability of the natural frequency $\omega_n$, a tuning circuit 203 is implemented. The tuning circuit 203 can maintain a RC product of the PLL circuit 200 substantially constant by adjusting either the plurality of resistive elements or the plurality of capacitive elements. The natural frequency $\omega_n$ of the PLL circuit 200 is a function of the RC product, and thus is in turn maintained substantially constant irrespectively of manufacturing process and operation environments.

Figure 3:
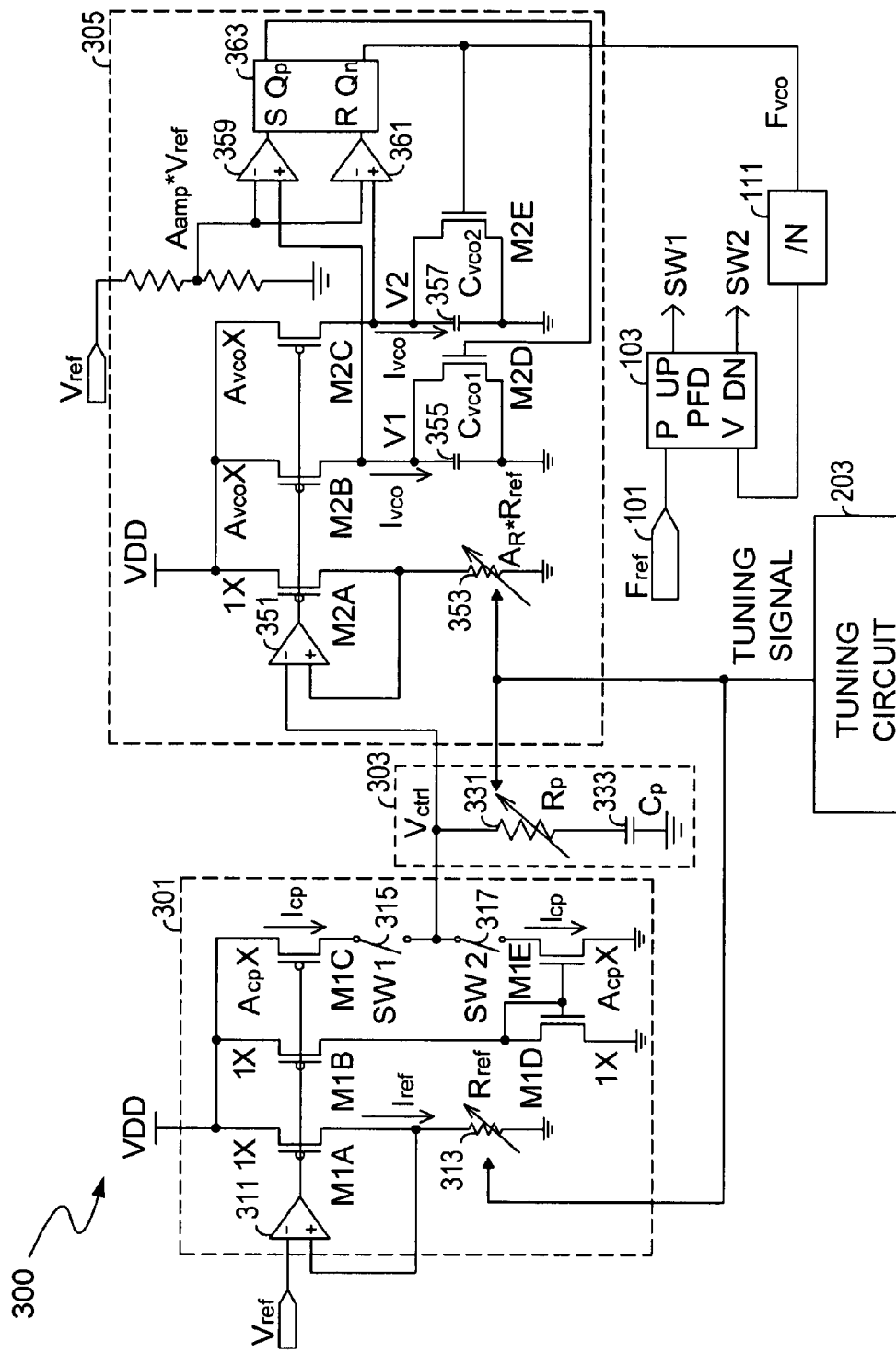
FIG. 3 is a schematic diagram of a loop path according to one embodiment of the present invention.

FIG. 3 illustrates a schematic diagram of a second order PLL circuit 300 according to one embodiment of the present invention. Elements labeled the same in FIGS. 1 and 2 have similar functions and will not be repetitively described herein for purposes of brevity and clarity. The loop path in the PLL circuit 300 includes a charge pump 301, a loop filter 303 and a VCO 305. The charge pump 301 may include an operational amplifier 311, a reference resistor 313, metal oxide semiconductor (MOS) transistors M1A to M1E, and switches 315 and 317. Via the operational amplifier 311 and the MOS transistor M1A, a reference voltage $V_{ref}$ is applied to the reference resistor 313 to generate a reference current $I_{ref}$. The reference current $I_{ref}$ flows through the reference resistor 313 as well as the MOS transistor M1A, which may be given by $$I_{ref} = \frac{V_{ref}}{R_{ref}} \qquad (3)$$

where $R_{ref}$ is the resistance of the reference resistor 313. Based on the reference current $I_{ref}$, a current mirror formed by the MOS transistors M1A to M1E produces a charge pump current $I_{cp}$ respectively flowing through the MOS transistor M1C and the MOS transistor M1E. According to mirroring parameters of the current mirror, e.g., width-to-length ratios, a mirror gain $A_{cp}$ is realized between the charge pump current $I_{cp}$ and the reference current $I_{ref}$. The charge pump current $I_{cp}$ may be given by $$I_{cp} = A_{cp} I_{ref} = A_{cp} \frac{V_{ref}}{R_{ref}} \qquad (4)$$

The switches 315 and 317 are coupled to the MOS transistor M1C and M1E respectively, to enable current sourcing and current sinking alternatively. When the switch 315 is turned on by an asserted switch enabling signal SW1, the charge pump 301 will act as a current source to supply the charge pump current $I_{cp}$ that flows from the MOS M1C to the loop filter 303. In contrast, when the switch 317 is turned on by an asserted switch enabling signal SW2, the charge pump 301 will act as a current sink to receive the charge pump current $I_{cp}$ that flows from the loop filter 303 to the MOS M1E. Additionally, the switch enabling signals SW1 and SW2 are alternatively asserted depending on the phase difference detected by the PFD 103.

In response to the charge pump current $I_{cp}$ sourced or sunk by the charge pump 301, an oscillator control voltage $V_{ctrl}$ is produced by the loop filter 303. The loop filter 303 can have a variety of configurations. For example, a filter resistor 331 and a filter capacitor 333 coupled in series may form the loop filter 303. When the switch 315 is turned on, the charge pump current $I_{cp}$ flows from the MOS transistor M1C to the loop capacitor 333, sequentially through the switch 315 and the loop resistor 331. In this instance, the loop capacitor 333 is charged and consequently the oscillator control voltage $V_{ctrl}$ will increase. When the switch 317 is turned on, the charge pump current $I_{cp}$ flows from the loop capacitor 333 to the MOS transistor M1E, sequentially through the loop resistor 331 and the switch 317. In this instance, the loop capacitor 333 is discharged and consequently the oscillator control voltage $V_{ctrl}$ will decrease.

According to the oscillator control voltage $V_{ctrl}$, the VCO 305 adjusts an output clock frequency $F_{VCO}$ up or down. As shown in FIG. 3, the VCO 305 may include an operational amplifier 351, a reference resistor 353, MOS transistors M2A to M2C, oscillator capacitors 355 and 357, comparators 359 and 361, and a flip-flop 363.

The operational amplifier 351 in conjunction with the MOS transistor M2A applies the oscillator control voltage $V_{ctrl}$ to the reference resistor 353. As a result, a current is generated to flow through the reference resistor 353 as well as the MOS transistor M2A. Based on the current, a current mirror formed by the MOS transistors M2A to M2C produces an oscillator current $I_{VCO}$ respectively flowing through the MOS transistors M2B and M2C. According to mirroring parameters of the current mirror, e.g., width-to-length ratios, a mirror gain $A_{VCO}$ may be realized between the oscillator current $I_{VCO}$ and the current flowing through the MOS transistor M2A. The oscillator current $I_{VCO}$ can be given by $$I_{VCO} = \frac{V_{ctrl}}{A_R R_{ref}} A_{VCO} \tag{5}$$

where $A_R^* R_{ref}$ is defined as the resistance of the reference resistor 353 for simplifying associated equations.

The oscillator capacitors 355 and 357 are coupled respectively to the MOS transistors M2B and M2C for being charged alternatively. To control the charging and discharging processes of the oscillator capacitors 355 and 357, switching devices, for example MOS transistors M2D and M2E, are coupled in parallel with the oscillator capacitors 355 and 357 respectively. When the MOS transistor M2D is switched off and the MOS transistor M2E is switched on, the oscillator capacitor 355 is charged by receiving the oscillator current $I_{VCO}$ from the MOS transistor M2B, while the oscillator capacitor 357 is discharged via the MOS transistor M2E. In contrast, when the MOS transistor M2D is switched on and the MOS transistor M2E is switched off, the oscillator capacitor 357 is charged by receiving the oscillator current $I_{VCO}$ from the MOS transistor M2C, while the oscillator capacitor 357 is discharged via the MOS transistor M2D.

Additionally, oscillator voltages V1 and V2 across the oscillator capacitors 355 and 357 are further fed to the non-inverting terminals of the comparators 359 and 361 respectively, for being compared with a reference voltage at the inverting terminals of the comparators 359 and 361. The reference voltage is herein defined as $A_{amp}$ times the reference voltage $V_{ref}$ ($A_{amp}^* V_{ref}$) for simplifying associated equations. Outputs of the comparators 359 and 361 are received by input set (S) and input reset (R) terminals of the flip-flop 363 respectively. In response to the received signals, the flip-flop 363 generates the output clock $F_{VCO}$ at output $Q_p$ and $Q_n$ terminals. The MOS transistors M2D and M2E are further controlled by the output clock $F_{VCO}$ to shift the charging and discharging processes of the oscillator capacitors 355 and 357 periodically. In this way, the VCO 305 will run continuously.

Figure 4:
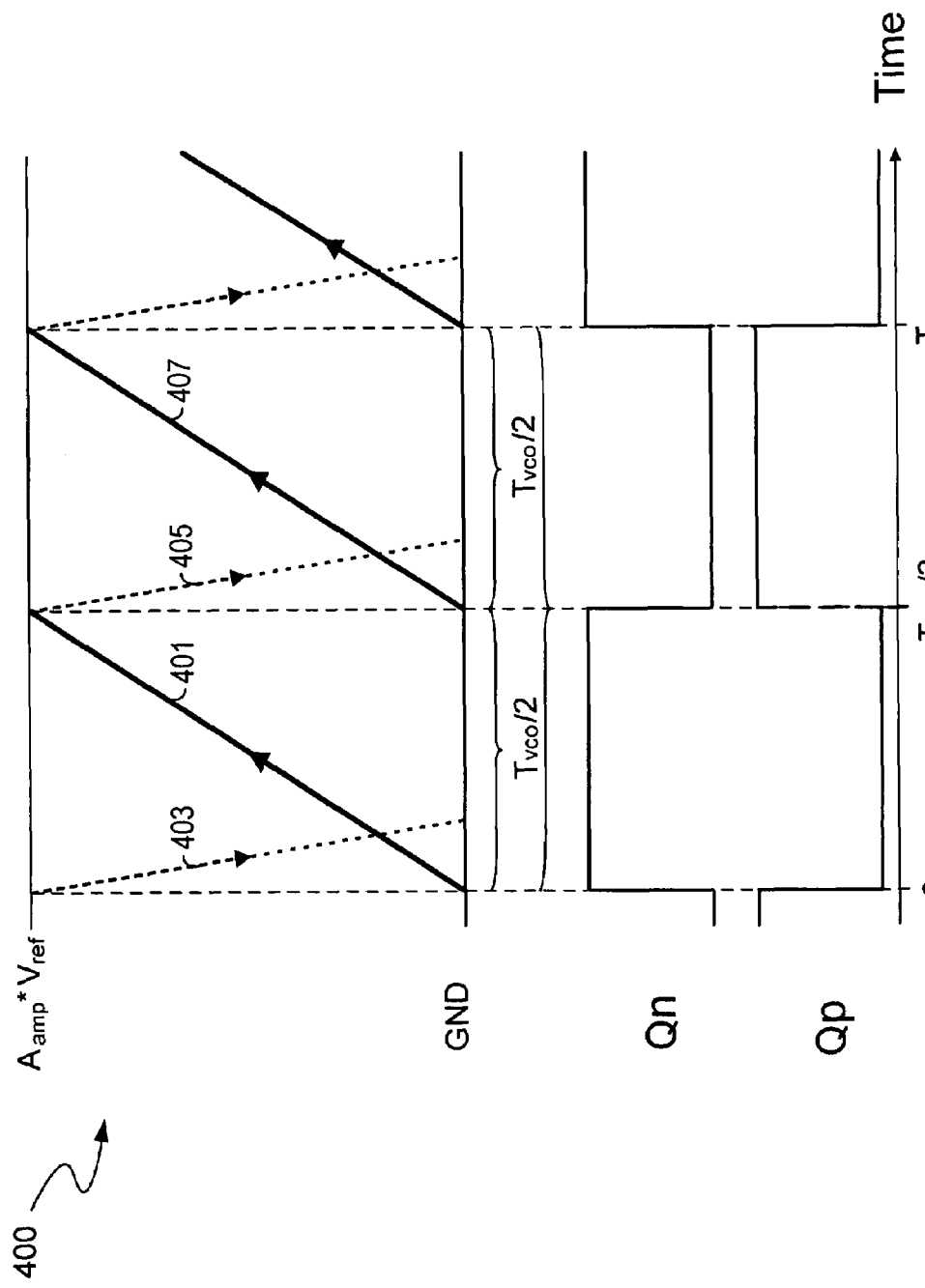
FIG. 4 is a timing diagram of a VCO according to one embodiment of the present invention.

FIG. 4 illustrates a timing diagram of the VCO 305 in FIG. 3 according to one embodiment of the present invention. In FIG. 4, it is assumed that the capacitance $C_{VCO1}$ of the oscillator capacitor 335 is identical to the capacitance $C_{VCO2}$ of the oscillator capacitor 337 and set to be $C_{VCO}$ for explanation purpose. Initially, supposing the MOS transistor M2D is switched off and the MOS transistor M2E is switched on, the oscillator capacitor 335 is charged by the oscillator current $I_{VCO}$ and the oscillator capacitor 337 is discharged via the MOS transistor M2E. The discharging process as illustrated by a waveform 403 is completed quickly. The charging process as illustrated by a waveform 401 is terminated at time $T_{VCO}/2$, when the oscillator voltage V1 attains $A_{amp}^* V_{ref}$. The time $T_{VCO}/2$ can be give by $$\frac{T_{VCO}}{2} = \frac{C_{VCO}(A_{amp} V_{ref})}{I_{VCO}} \tag{6}$$

At time $T_{VCO}/2$, the comparator 359 outputs a logic high value. In response to the logic high value at the input S terminal of the flip-flop 363, a rising-edge presents at the output $Q_p$ terminal and a falling-edge presents at the output $Q_n$ terminal. Controlled by the signals from the output $Q_p$ and $Q_n$ terminals, the MOS transistor M2D shifts from off to on while the MOS transistor M2E shifts from on to off. As a result, the discharging process of the oscillator capacitor 355 is triggered as illustrated by a waveform 405 and the charging process of the oscillator capacitor 357 is triggered as illustrated by a waveform 407. Similarly, the charging process is terminated at time $T_{VCO}$, when the oscillator voltage V2 attains $A_{amp}^* V_{ref}$. At time $T_{VCO}$, the comparator 361 outputs a logic high value. In response to the logic high value at the input R terminal of the flip-flop 363, a falling-edge presents at the output $Q_p$ terminal and a rising-edge presents at the output $Q_n$ terminal. Controlled by the signals from the output $Q_p$ and $Q_n$ terminals, the MOS transistor M2D shifts from on to off while the MOS transistor M2E shifts from off to on. In this way, the oscillation cycle proceeds spontaneously and continuously.

According to the equations (5) and (6), the output frequency signal $F_{VCO}$ can be given by $$F_{VCO} = \frac{1}{T_{VCO}} = \frac{I_{VCO}}{2C_{VCO}(A_{amp} V_{ref})} = \frac{\left(\frac{V_{ctrl}}{A_R R_{ref}}\right) A_{VCO}}{2 C_{VCO}(A_{amp} V_{ref})} \tag{7}$$

Therefore, the tuning sensitivity $K_{VCO}$ of the VCO 305 can be given by $$K_{VCO} = 2\pi \frac{d F_{VCO}}{d V_{ctrl}} \tag{8}$$

$$= \left(\frac{A_{VCO}}{A_R R_{ref}}\right) \frac{\pi}{C_{VCO}(A_{amp} V_{ref})}$$

$$= \frac{A_{VCO} \pi}{C_{VCO} V_{ref} A_{amp} A_R R_{ref}}$$

Substituting the equation (8) into the equations (1) and (2):

$$\delta = \frac{R_p}{2} \sqrt{\left(\frac{A_{cp} V_{ref}}{R_{ref}}\right)\left(\frac{A_{VCO} \pi}{C_{VCO} V_{ref} A_{amp} A_R R_{ref}}\right)\left(\frac{C_p}{2\pi N}\right)} \tag{9}$$

$$= \sqrt{\left(\frac{1}{8N}\right) \frac{R_p^2}{R_{ref}^2} \frac{C_p}{C_{VCO}} \frac{A_{cp} A_{VCO}}{A_{amp} A_R}}$$

$$\omega_n = \sqrt{\left(\frac{A_{cp}V_{ref}}{R_{ref}}\right)\left(\frac{A_{VCO}\pi}{C_{VCO}V_{ref}A_{amp}A_R R_{ref}}\right)\left(\frac{1}{2\pi C_p N}\right)} \quad (10)$$

$$= \sqrt{\frac{1}{R_{ref}^2 C_{VCO} C_p N} \left(\frac{A_{cp}A_{VCO}}{2A_{amp}A_R}\right)} \propto \frac{1}{RC}$$

where $R_{ref}$ is the resistance of the reference resistor 313, $A_R*R_{ref}$ is the resistance of the reference resistor 353, $R_p$ is the resistance of the filter resistor 331, $C_p$ is the capacitance of the filter capacitor 333, and $C_{VCO}$ is the capacitance of the oscillator capacitor 355 (357).

Referring to the equation (9), it can be concluded that the damping factor δ will be maintained at a substantially constant value if the resistance $R_p$ varies in proportion to both resistances $R_{ref}$ and $A_R*R_{ref}$ and the capacitance $C_p$ varies in proportion to the capacitance $C_{VCO}$. This may be achieved by employing the reference resistor 313, the reference resistor 353 and the filter resistor 331 of the same type or material and employing the filter capacitor 333 and the oscillator capacitors 355 and 357 of the same type or material. In addition, if the divider factor N changes to adjust the output frequency $F_{VCO}$, the damping factor δ can still be maintained substantially constant by adjusting the mirror gains $A_{cp}$ and/or $A_{VCO}$.

Referring to the equation (10), it can be concluded that the natural frequency $\omega_n$ will be maintained at a substantially constant value if a RC product of the resistance $R_{ref}$, the resistance $A_R*R_{ref}$, the capacitance $C_p$ and the capacitance $C_{VCO}$ is substantially constant. This may be achieved by employing the tuning circuit 203, which adjusts either the reference resistor 313 and the reference resistor 353 or the filter capacitor 333 and the oscillator capacitors 355 and 357 to maintain the RC product substantially constant.

Furthermore, if the filter capacitor 333 and the oscillator capacitors 355 and 357 are adjusted by a tuning signal provided by the tuning circuit 203, the capacitance $C_p$ still varies in proportion to the capacitance $C_{VCO}$ due to being made of the same type or material. Therefore, the damping factor δ will not be impacted according to the equation (9). If the reference resistor 313 and the reference resistor 353 is adjusted by the tuning signal as illustrated in FIG. 3, the filter resistor 331 can be adjusted by the same tuning signal to ensure that the resistance $R_p$ always varies in proportion to both resistances $R_{ref}$ and $A_R*R_{ref}$. Therefore, the damping factor δ will not be impacted according to the equation (9). Consequently, the damping factor δ and the natural frequency $\omega_n$ can be simultaneously maintained constant irrespectively of manufacturing process and operation environments.

Referring to FIGS. 2 and 3, it should be understood that the reference resistor 313 corresponds to the charge resistor section 211, the filter resistor 331 corresponds to the filter resistor section 213, the reference resistor 353 corresponds to the oscillator resistor section 217, the filter capacitor 333 corresponds to the filter capacitor section 215 and the oscillator capacitors 355 and 357 correspond to the oscillator capacitor section 219. The schematic diagram in FIG. 3 is one embodiment of the block diagram in FIG. 2 for the purpose of explanation but not limitation. More embodiments of the present invention will be depicted in the following sections to demonstrate a variety of alternative PLL circuit configurations.

Figure 5:
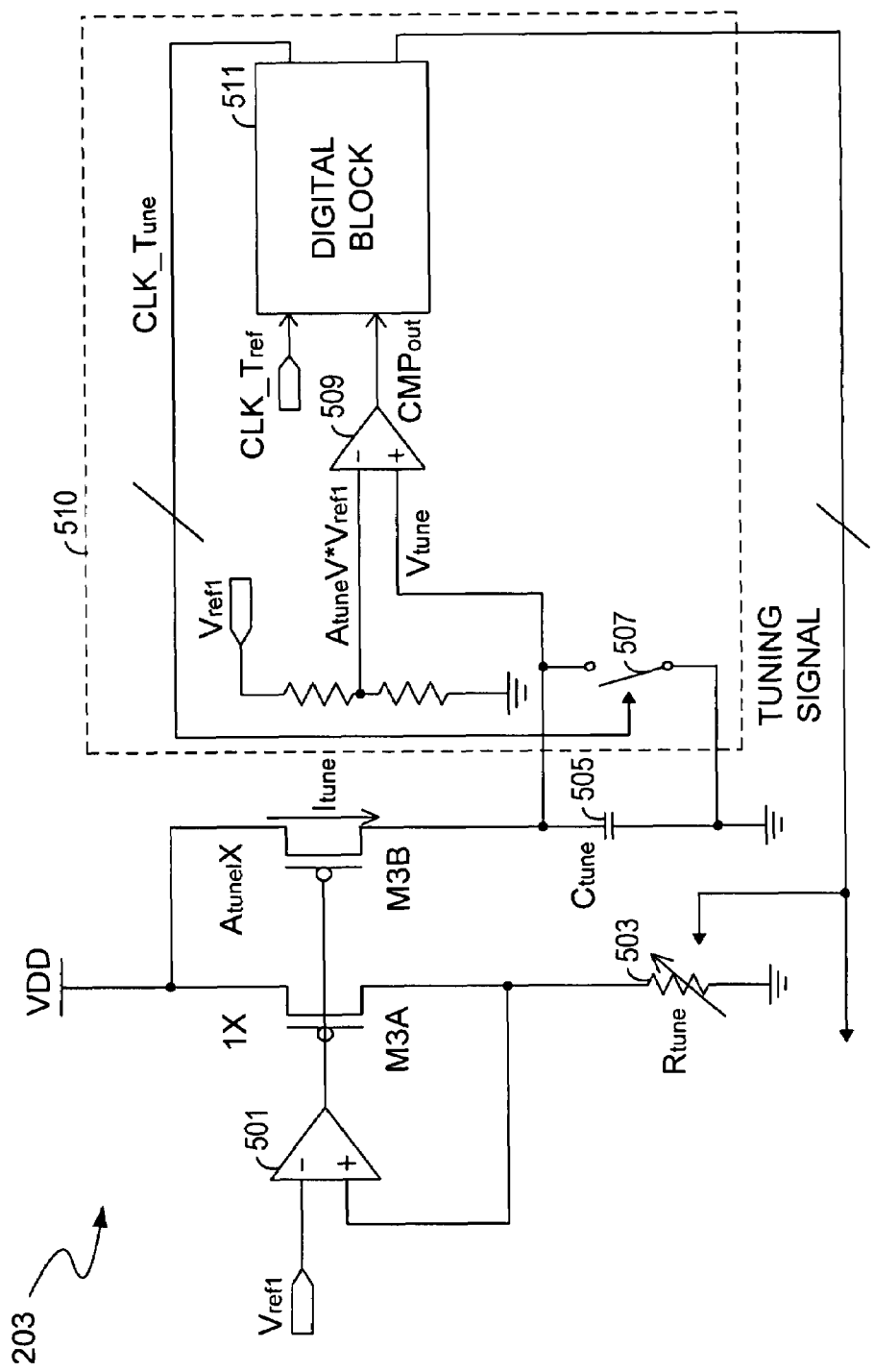
FIG. 5 is a schematic diagram of a tuning circuit according to one embodiment of the present invention.

FIG. 5 illustrates a schematic diagram of the tuning circuit 203 according to one embodiment of the present invention. The tuning circuit 203 may include an operational amplifier 501, a tuning resistor 503, a tuning capacitor 505, MOS transistors M3A and M3B, and a tuning signal generator 510 formed by a switch 507, a comparator 509 and a digital block 511.

The operational amplifier 501 in conjunction with the MOS transistor M3A applies a reference voltage $V_{ref1}$ to the tuning resistor 503. As a result, a current is generated to flow through the tuning resistor 503 as well as the MOS transistor M3A. Based on the current, a current mirror formed by the MOS transistors M3A and M3B generates a tuning current $I_{tune}$ flowing through the MOS transistor M3B. According to mirroring parameters of the current mirror, e.g., width-to-length ratios, a mirror gain $A_{tune1}$ may be realized between the tuning current $I_{tune}$ and the current flowing through the MOS transistor M3A. The tuning current $I_{tune}$ can be given by $$I_{tune} = \frac{V_{ref1}}{R_{tune}} A_{tune1} \quad (11)$$

where $R_{tune}$ is the resistance of the tuning resistor 503.

The tuning capacitor 505 is coupled to the MOS transistors M3B for being charged. To control the charging and discharging processes of the tuning capacitor 505, the switch 507 is coupled in parallel with the tuning capacitor 505. When the switch 507 is switched off, the tuning capacitor 505 is charged by receiving the tuning current $I_{tune}$ from the MOS transistor M3B. In contrast, when the switch 507 is switched on, the tuning capacitor 505 is discharged via the switch 507. A tuning voltage $V_{tune}$ is produced across the tuning capacitor 505 during the charging and discharging processes.

In the tuning signal generator 510, the tuning voltage $V_{tune}$ across the tuning capacitor 505 is further fed to a non-inverting terminal of the comparator 509, for being compared with a reference voltage at an inverting terminal of the comparator 509. The reference voltage at the inverting terminal is herein defined as $A_{tuneV}*V_{ref1}$ for simplifying associated equations. An output signal $CMP_{out}$ from the comparator 509 is further received by the digital block 511, which also receives a reference clock signal $CLK\_T_{ref}$ and generates the tuning signal and a timing signal $CLK\_T_{une}$. The digital block 511 may be constructed of a variety of digital circuits, for example a 5-bit counter. The timing signal $CLK\_T_{une}$ is applied to the switch 507 for controlling an off and on period of the switch 507 and consequently to control charging and discharging periods of the capacitor 505.

The tuning signal, for example a 3-bit code, is applied to the tuning resistor 503 in FIG. 5 and the reference resistor 313, the reference resistor 353 and the filter resistor 331 in FIG. 3 simultaneously. Adjusted by the tuning signal, the resistance $R_{tune}$ of the tuning resistor 503 will vary in inverse proportion to the capacitance $C_{tune}$ of the tuning capacitor 505 to maintain a constant $R_{tune}C_{tune}$ product, which will be described in details in the following sections. When the tuning resistor 503 is of the same type or material with the reference resistor 313, the reference resistor 353 and the filter resistor 331 and the tuning capacitor 505 is of the same type or material with the filter capacitor 333 and the oscillator capacitors 355 and 357, the RC product of the resistance $R_{ref}$, the resistance $A_R*R_{ref}$, the capacitance $C_p$ and the capacitance $C_{VCO}$ will also be maintained substantially constant due to the same tuning signal. Consequently, the natural frequency $\omega_n$ is maintained substantially constant according to the equation (10).

Instead of applying the tuning signal to the tuning resistor 503, the reference resistor 313, the reference resistor 353 and the filter resistor 331 simultaneously, the tuning signal can also be applied to the tuning capacitor 505, the filter capacitor 333 and the oscillator capacitors 355 and 357 simultaneously to adjust the corresponding capacitances. Similarly, the RC product of the resistance $R_{ref}$, the resistance $A_R*R_{ref}$, the capacitance $C_p$ and the capacitance $C_{VCO}$ can be kept constant to maintain the natural frequency $\omega_n$ substantially constant according to the equation (10).

Figure 6:
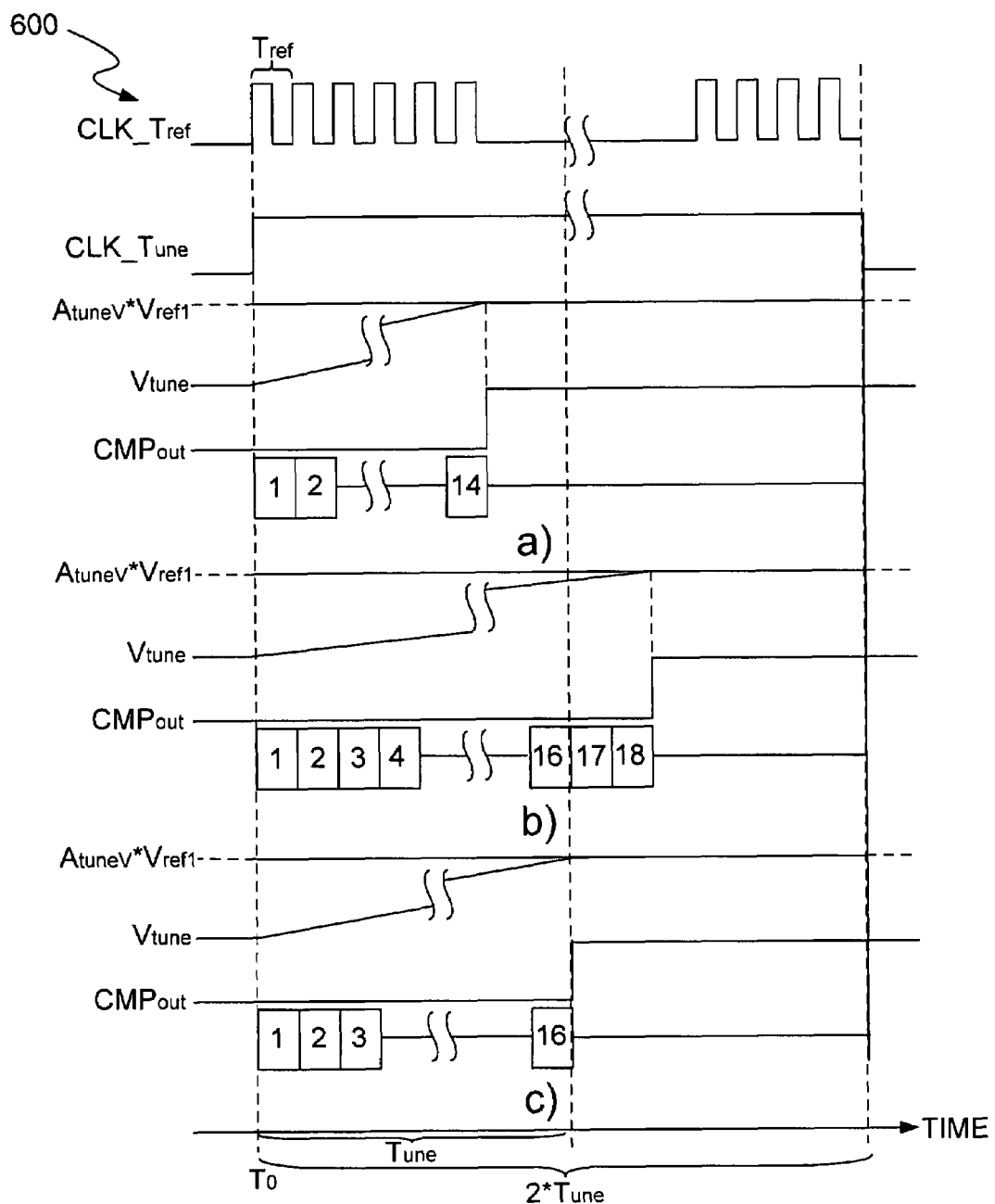
FIG. 6 is a timing diagram of a tuning circuit according to one embodiment of the present invention.

FIG. 6 illustrates a timing diagram of a tuning circuit according to one embodiment of the present invention. At time $T_0$, the digital block 511 asserts the timing signal CLK_$T_{une}$. In response to the asserted timing signal CLK_$T_{une}$, the switch 507 is tuned off to start the charging process of the tuning capacitor 505. At time $T_{tune}$, the tuning voltage across the tuning capacitor 505 attains $A_{tuneV}*V_{ref1}$. The time $T_{tune}$ can be given by $$T_{tune}I_{tune} = C_{tune}A_{tuneV}V_{ref1} \quad (12)$$

Furthermore, it should be guaranteed that the off period of the switch 507 exceeds $T_{tune}$, for example, the timing signal CLK_$T_{une}$ may be kept asserted for a period of $2*T_{tune}$. Also, the time $T_{tune}$ can also be given by $$T_{tune} = N_{tune}T_{ref} \quad (13)$$

where $T_{ref}$ is defined as a cycle period of the reference clock signal CLK_$T_{ref}$, and $N_{tune}$ is defined as the cycle number of the period $T_{tune}$. Referring to the equations (11), (12) and (13), the following equation (14) may be obtained:

$$R_{tune}C_{tune} = \frac{N_{tune}A_{tuneI}T_{ref}}{A_{tuneV}} \quad (14)$$

As mentioned previously, the tuning circuit 203 is designed specially for achieving the constant $R_{tune}C_{tune}$ product according to the equation (14). To this end, there is a constant target value preset for the cycle number $N_{tune}$. For example, supposing the digital clock 511 is made of a 5-bit counter, the target value for the cycle number $N_{tune}$ is preferably to be 16 to obtain a wider tuning range. During the tuning process, the digital block 511 counts the cycle number $N_{tune}$. Depending on the difference between the counted cycle number $N_{tune}$ and the preset target value 16, the digital block 511 increases or decreases the tuning signal, which may be a 3-bit code. With the tuning signal increased or decreased, the tuning resistor 503 and the reference resistor 313, the reference resistor 353 and the filter resistor 331 are adjusted accordingly until the counted cycle number $N_{tune}$ is equal to 16. Therefore, the $R_{tune}C_{tune}$ product is kept constant at the value $$\frac{16*A_{tuneI}*T_{ref}}{A_{tuneV}}.$$

As stated previously, the RC product of the resistance $R_{ref}$, the resistance $A_R*R_{ref}$, the capacitance $C_p$ and the capacitance $C_{VCO}$ will also be maintained substantially constant due to the same tuning signal.

The plots (a), (b) and (c) in FIG. 6 represent three tuning scenarios. In plot (a), when the tuning voltage across the tuning capacitor 505 attains the reference voltage $A_{tuneV}*V_{ref1}$, a rising-edge occurs at the output signal $CMP_{out}$ of the comparator 509. The digital block 511 counts 14 clock cycles before occurrence of the rising-edge, which indicates that the tuning signal should be increased to obtain a larger tuning resistor 503 and therefore a larger cycle number $N_{tune}$. In plot (b), when the tuning voltage across the tuning capacitor 505 attains the reference voltage $A_{tuneV}*V_{ref1}$, a rising-edge occurs at the output signal $CMP_{out}$ of the comparator 509. The digital block 511 counts 18 clock cycles before occurrence of the rising-edge, which indicates that the tuning signal should be decreased to obtain a smaller tuning resistor 503 and therefore a smaller cycle number $N_{tune}$. In plot (c), when the tuning voltage across the tuning capacitor 505 attains the reference voltage $A_{tuneV}*V_{ref1}$, a rising-edge occurs at the output signal $CMP_{out}$ of the comparator 509. The digital block 511 counts 16 clock cycles before occurrence of the rising-edge, which indicates that a steady state has been achieved, where the $R_{tune}C_{tune}$ product is maintained substantially constant with the preset target value 16 of the cycle number $N_{tune}$.

Figure 7:
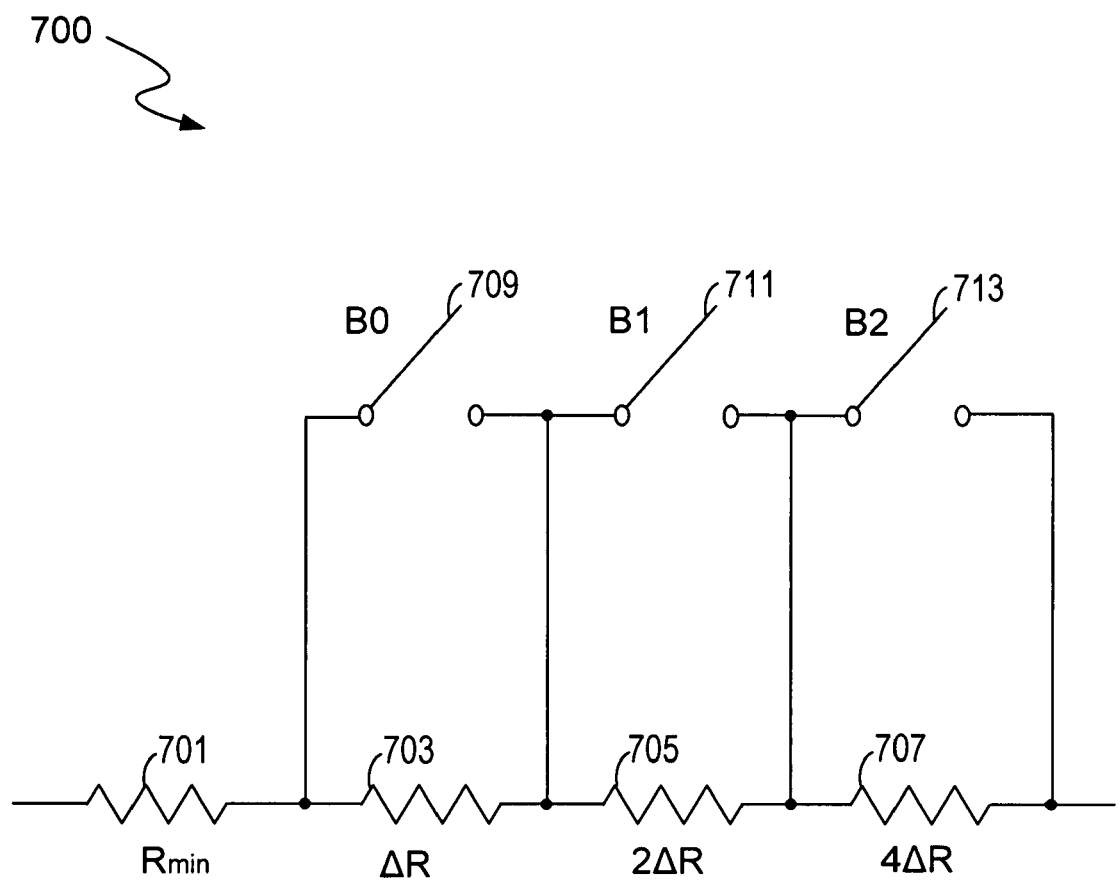
FIG. 7 is a schematic diagram of a switchable resistor array according to one embodiment of the present invention.

FIG. 7 illustrates a schematic diagram of a switchable resistor array 700. The resistive elements, for example the tuning resistor 503, the reference resistor 313, the reference resistor 353 and the filter resistor 331, may adopt this switchable resistor array structure to allow the corresponding resistances controlled digitally by the tuning signal, which may be a digital code. Supposing that the tuning signal is a 3-bit code, B2B1B0, the switchable resistor array 700 may include a minimum resistor 701, a resistor 703, a resistor 705, a resistor 707, a switch 709, a switch 711 and a switch 713. The resistors 701 to 707 are coupled in series sequentially. The switches 709 to 713 each is coupled in parallel with one of the resistors 703 to 707, such that a short circuit will occur to a predetermined resistor when the associated switch is tuned on under control of the 3-bit code, B2B1B0. Additionally, according to a predetermined resistance range, the resistance of each resistor and relationships between these resistors may be set, for example the resistance of the minimum resistor 701 is set to be $R_{min}$, the resistance of the resistor 703 is set to be $\Delta R$, the resistance of the resistor 705 is set to be $2\Delta R$, and the resistance of the resistor 707 is set to be $4\Delta R$. Furthermore, the switchable resistor array 700 may extend in a similar way for a higher resolution when the tuning code uses more bits.

Figure 8:
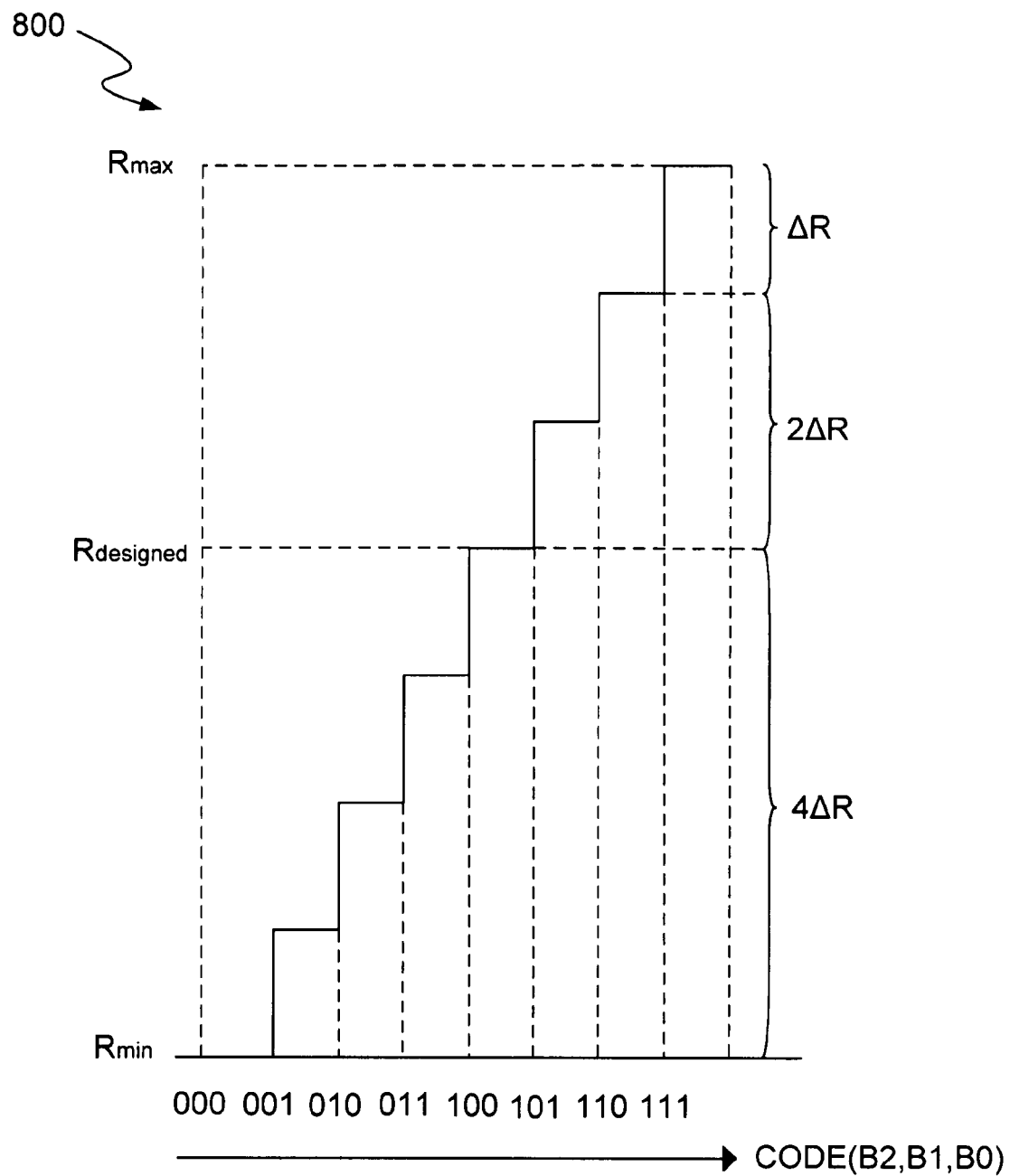
FIG. 8 is a plot illustrating resistance values of a switchable resistor array versus tuning signals.

FIG. 8 is a plot 800 illustrating resistance values of the switchable resistor array versus the tuning codes. The bits B0 to B2 control the conduction status of the switches 709 to 713 respectively. When the tuning code B2B1B0 is set to be 000, the switchable resistor array acquires the minimum resistance $R_{min}$. When tuning code B2B1B0 is set to be 111, the switchable resistor array acquires the maximum resistance $R_{min}+7\Delta R$. To achieve a wider resistance deviation, the designed value of the switchable resistor array may be given by $$R_{designed} = R_{min} + 4 \times \Delta R \quad (15)$$

If $\Delta R$ is set to be 10% of $R_{designed}$ and $R_{designed}$ is defined as unit, a −40% to +30% resistance deviation may be achieved with the exemplary switchable resistor array 700. In other words, if the designed value of the switchable resistor array is preset, the minimum resistance $R_{min}$ may be given by $$R_{min} = R_{designed} - 4 \times \Delta R \quad (16)$$

Additionally, it will be appreciated by one skilled in the art that the capacitive elements, for example the tuning capacitor 505, the filter capacitor 333, and the oscillator capacitors 355 and 357, may adopt a similar structure to allow the corresponding capacitances controlled digitally by the tuning signal, the schematic diagram of which will not be repetitively described herein for the purpose of brevity.

Figure 9:
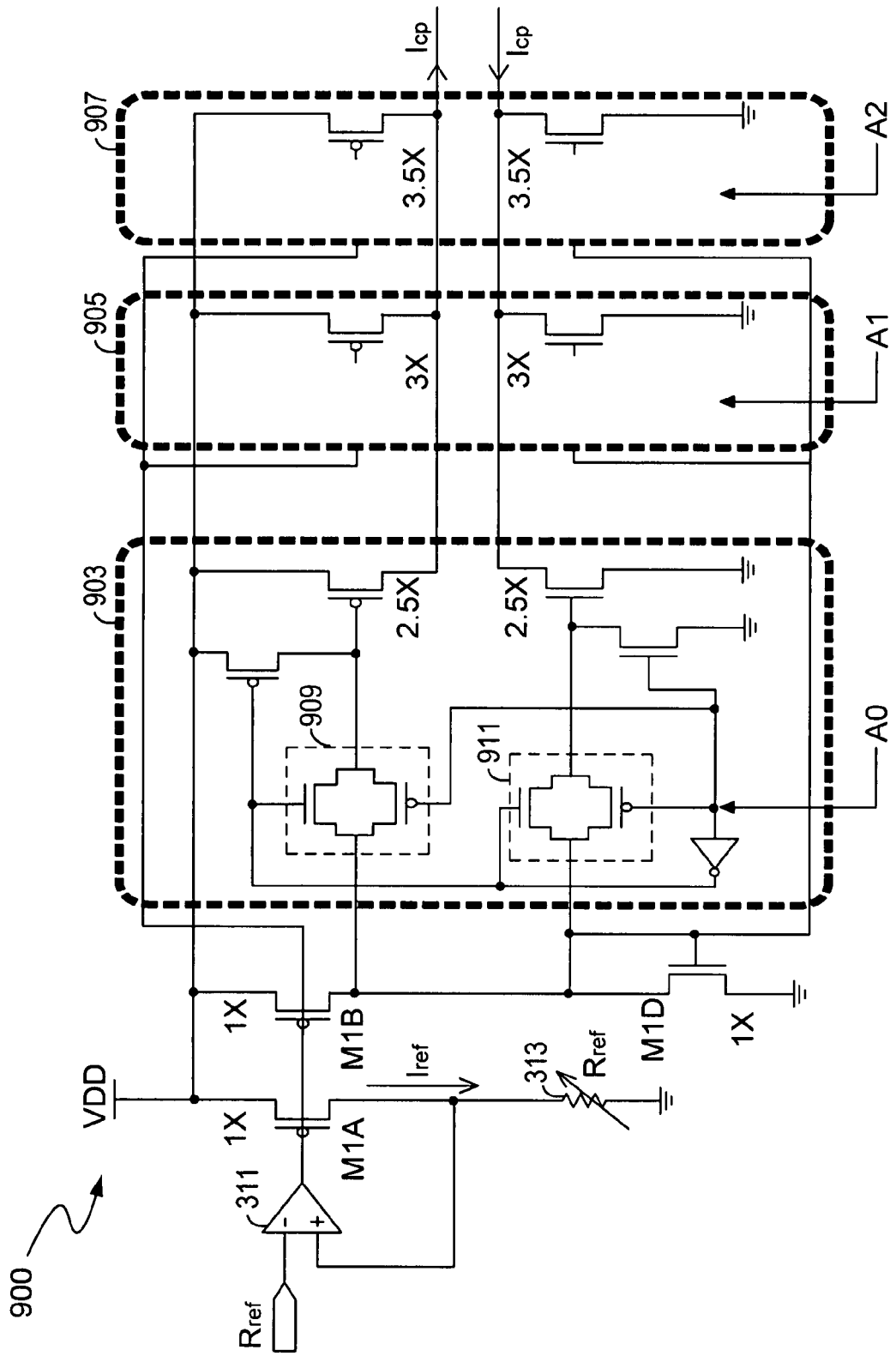
FIG. 9 is a schematic diagram of a charge pump according to another embodiment of the present invention.

FIG. 9 illustrates a schematic diagram of a charge pump 900 according to another embodiment of the present invention. Elements labeled the same in FIG. 3 have similar functions and will not be repetitively described herein for purposes of brevity and clarity. As shown in FIG. 9, the charge pump 900 includes a plurality of mirror cells with identical structures but distinct mirror gains to acquire a programmable mirror gain $A_{cp}$, fox example a mirror cell 903 with a mirror gain 2.5, a mirror cell 905 with a mirror gain 3.0 and a mirror cell 907 with a mirror gain 3.5. The programmable mirror gain $A_{cp}$ is determined by a digital selection signal. Each bit of the digital selection signal is coupled to one of the plurality of mirror cells via an associated selector device. For example, the bit A0 is coupled to the mirror cell 903 via the selector device formed by a pass gate 909 and a pass gate 911. When the bit A0 is set to be 0, the pass gates 909 and 911 are conducted and such that the mirror cell 903 is selected to generate the charge pump current $I_{cp}$ according to the mirror gain 2.5. Similarly, depending on the digital selection signal, another mirror cell may be selected to generate the charge pump current $I_{cp}$ according to the corresponding mirror gain.

In addition, it will be appreciated by the one skilled in the art that the plurality of mirror cells can be easily implemented in the VCO 305 to acquire a programmable mirror gain $A_{VCO}$. Referring to the equation (9), when the divider factor N changes to adjust the output frequency $F_{VCO}$, the damping factor δ may still be maintained substantially constant by adjusting the mirror gains $A_{cp}$ and/or $A_{VCO}$ To this end, the digital selection signal can be asserted according to the divider factor N to obtain the corresponding $A_{cp}$ and/or $A_{VCO}$, with which the damping factor δ is maintained substantially constant with respect to the selected N.

Figure 10:
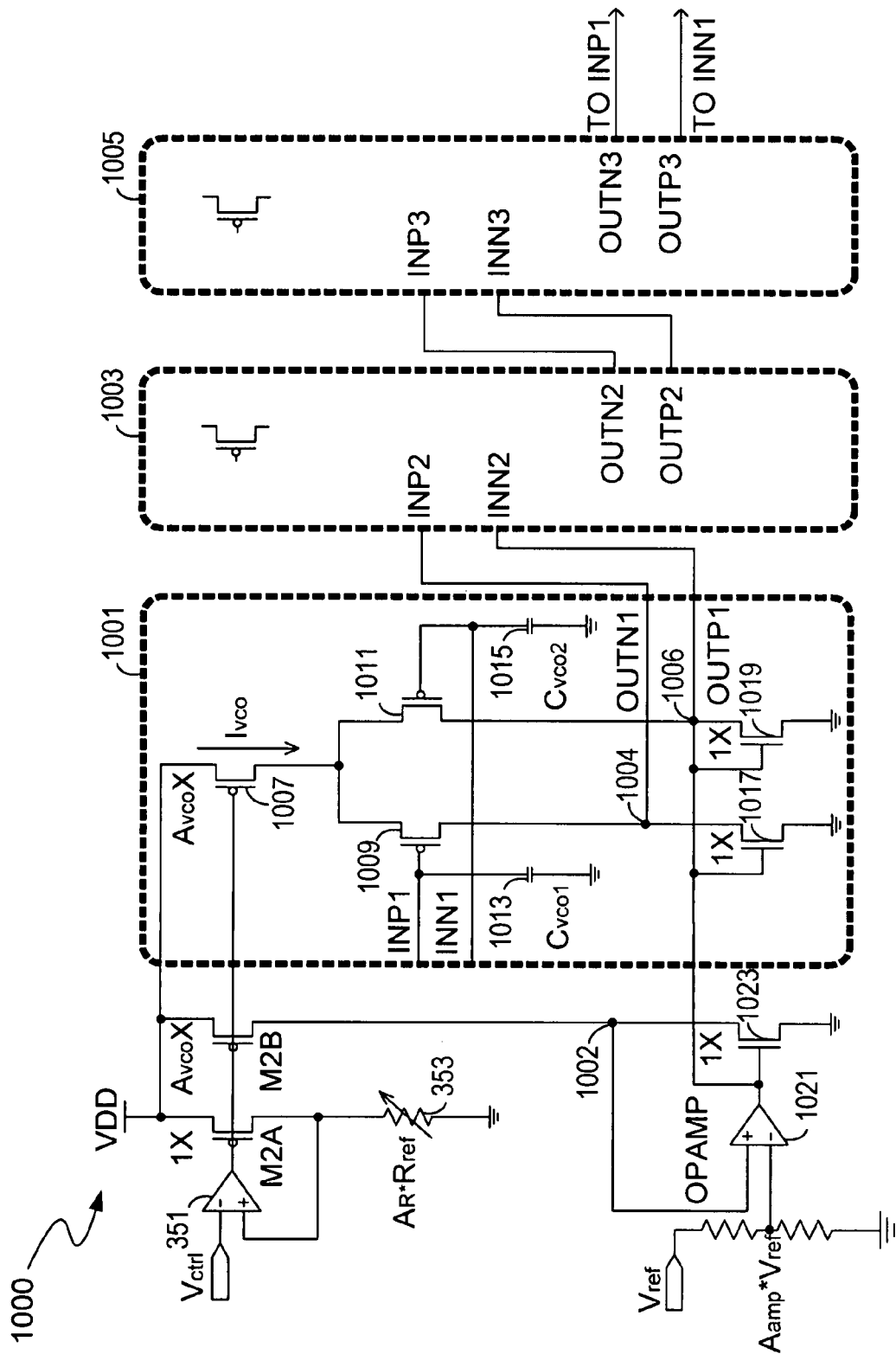
FIG. 10 is a schematic diagram of a VCO according to another embodiment of the present invention.

FIG. 10 illustrates a schematic diagram of a VCO 1000 according to another embodiment of the present invention. Elements labeled the same in FIG. 3 have similar functions and will not be repetitively described herein for purposes of brevity and clarity. The VCO 1000, called a ring oscillator, includes a plurality of inverter cells coupled in cascade, fox example inverter cell 1001, inverter cell 1003 and inverter cell 1005. The plurality of inverter cells have identical structures. For example, the inverter cell 1001 includes a MOS transistor 1007, a differential input pair formed by MOS transistors 1009 and 1011, oscillator capacitors 1013 and 1015 and MOS transistors 1017 and 1019.

The MOS transistor 1007 is used to form a current mirror with the MOS transistors M2A. Via this current mirror, an oscillator current $I_{VCO}$ is generated to flow through the MOS transistor 1007. The MOS transistor 1007 is further coupled to the MOS transistors 1009 and 1011, which are turned on alternatively by input signals at input terminals INP1 and INN1. The oscillator capacitor 1013 is coupled to the gate terminal of the MOS transistor 1009 for being charged or discharged when the voltage at the input terminal INP1 changes. Similarly, the oscillator capacitor 1015 is coupled to the gate terminal of the MOS transistor 1011 for being charged or discharged when the voltage at the input terminal INN1 changes. The MOS transistor 1017 and 1019 are coupled respectively to the MOS transistors 1009 and 1011 for setting a voltage magnitude of the ring oscillator 1000. To this end, the MOS transistor 1007 is identical to the MOS transistor M2B, and the MOS transistor 1017 is identical to an MOS transistor 1023. Due to these identical elements, the voltage at node 1004 is equal to the voltage at node 1002 when the MOS transistor 1009 is turned on. Since the voltage at node 1002 is tied at $A_{amp*}V_{ref}$ by an operational amplifier 1021, the voltage at node 1004 is also tied to be $A_{amp*}V_{ref}$ when the MOS transistor 1009 is turned on. Similarly, the voltage at node 1006 is $A_{amp*}V_{ref}$ when the MOS transistor 1011 is turned on. In other words, the magnitude of the voltages at output terminals OUTN1 and OUTP1 is set to be $A_{amp*}V_{ref}$.

Supposing the voltages at the input terminals INP1 and INN1 of the inverter cell 1001 are initially logic low and logic high respectively, the MOS transistor 1007 will be turned on while the MOS transistor 1009 will be turned off. In this instance, all the oscillator current $I_{VCO}$ will flow through the MOS transistor 1007 to the MOS transistor 1017. Since the voltage at node 1004 is $A_{amp*}V_{ref}$, the voltages at the output terminals OUTN1 and OUTN2 will be respectively logic high and logic low. The voltages at the output terminals OUTN1 and OUTN2 are further processed by the inverter cells 1003 and 1005 sequentially in the same method and eventually the voltages of the output terminals OUTN3 and OUTP3 of the inverter cell 1005 are respectively logic high and logic low. The output terminal OUTN3 is further connected to the oscillator capacitor 1013 and the input terminal INP1. Due to the logic high value at the output terminal OUTN3, the oscillator capacitor 1013 is charged to $A_{amp*}V_{ref}$ and the MOS transistor 1009 is turned off. Similarly, due to the logic low value at the output terminal OUTP3, the oscillator capacitor 1015 is discharged to ground and the MOS transistor 1011 is turned on. In this way, the oscillation cycle proceeds spontaneously and continuously.

The oscillating frequency $F_{VCO}$ of the ring oscillator 1000 may be given by $$F_{VCO} = K_{constant} \frac{I_{VCO} A_{VCO}}{A_{amp} V_{ref} C_{VCO}} \qquad (17)$$

$$= K_{constant} \frac{V_{ctrl} A_{VCO}}{A_R R_{ref} A_{amp} V_{ref} C_{VCO}}$$

where $K_{constant}$ is a constant value depending on several factors, such as how many inverters are used in the ring oscillator 1000, and $C_{VCO}$ is the capacitance of the oscillator capacitor 1013 (1015). The optimum $K_{constant}$ may be obtained empirically via simulation of the ring oscillator 1000. According to the equation (17), the tuning sensitivity $K_{VCO}$ may be given by $$K_{VCO} = 2\pi \frac{d F_{VCO}}{d V_{ctrl}} = \frac{2\pi A_{VCO} K_{constant}}{A_R R_{ref} A_{amp} V_{ref} C_{VCO}} \qquad (18)$$

The equation (18) has a similar characteristic with the equation (8), which implies that the ring oscillator 1000 may replace the VCO 305 in FIG. 3 as an alternative. Referring to FIGS. 2 and 10, the oscillator capacitors 1013 and 1015 correspond to the oscillator capacitor section 219 and the reference resistor 353 corresponds to the oscillator resistor section 217.

Figure 11:
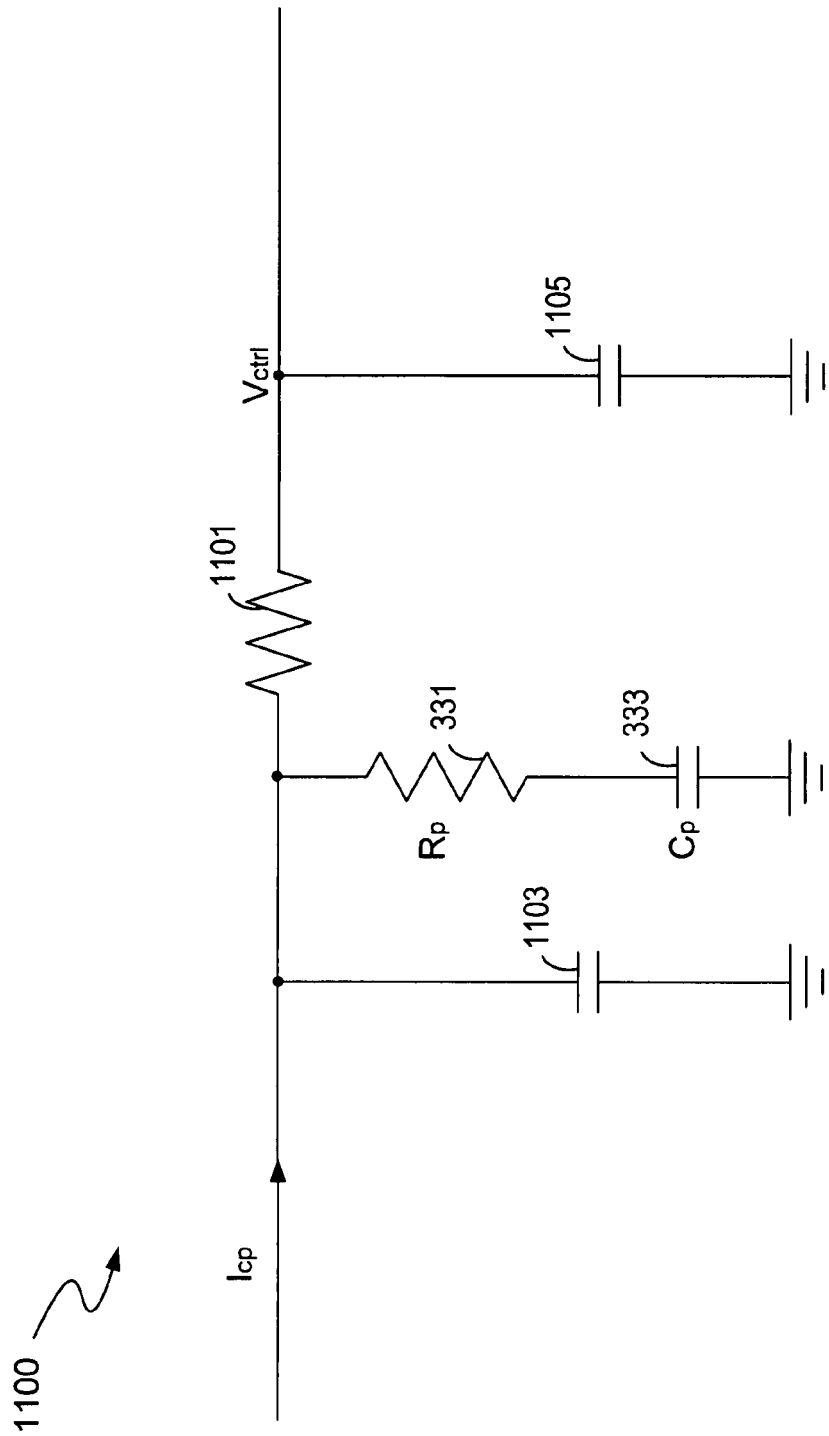
FIG. 11 is a schematic diagram of a loop filter according to another embodiment of the present invention.

FIG. 11 illustrates a schematic diagram of a loop filter circuit 1100 in a fourth order PLL circuit according to one embodiment of the present invention. Besides the filter resistor 331 and filter capacitor 333, the loop filter circuit 1100 further includes a capacitor 1103 creating a first additional pole, a resistor 1101 and a capacitor 1105 which create a second additional pole. The first additional pole may be ten times away from the natural frequency $\omega_n$ and the second additional pole is further away. These two poles merit the effect of reducing reference feedthrough due to periodic perturbation at the output $V_{ctrl}$ and tend not to affect the damping factor δ and natural frequency $\omega_n$ significantly. Nevertheless, the capacitors 1103 and 1105 may be of the same type or material with all other capacitive elements in the PLL and the resistor 1101 may be of the same type or material with all other resistive elements in the PLL to maintain the damping factor δ substantially constant. Similarly, either the resistors 331 and 1101 or the capacitors 333, 1103 and 1105 can be adjusted by the tuning signal to maintain the natural frequency $\omega_n$ substantially constant.

Referring to FIGS. 2 and 11, the resistor 1101 and the filter resistor 331 correspond to the filter resistor section 213. The filter capacitor 333 and the capacitors 1103 and 1105 correspond to the filter capacitor section 215. Also, the present invention is applicable to a third order PLL circuit, which will not be repetitively described herein for the purpose of brevity.

Referring to FIGS. 3, 5, 9 and 10, all MOS transistors as shown can be replaced by other known devices, for example bipolar junction transistors, junction gate field-effect transistors, etc., as long as the functionality as described is achieved. It will be understood that various additions, modifications and substitutions may be made therein without departing from the spirit and scope of the principles of the present invention as defined in the accompanying claims.

Figure 12:
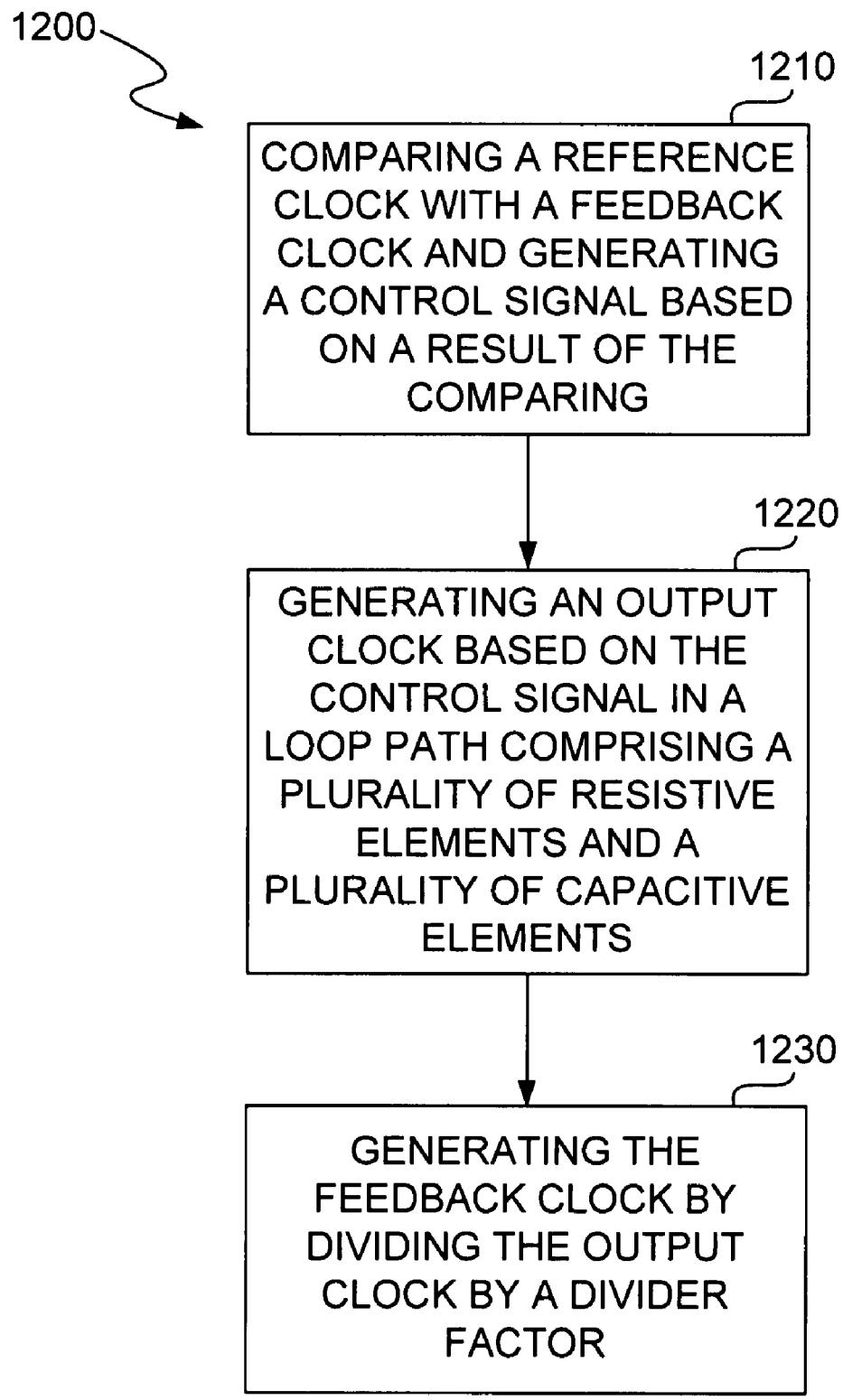
FIG. 12 is a flow chart of a method for operating a phase-locked loop circuit according to one embodiment of the present invention.

FIG. 12 is a flow chart 1200 of a method for operating a phase-locked loop circuit. Although specific steps are disclosed in FIG. 12, such steps are exemplary. That is, the present invention is well suited to performing various other steps or variations of the steps recited in FIG. 12.

In block 1210, a feedback clock is compared with a reference clock and a control signal is generated based on a result of the comparing. For example, the PLL circuit 200 includes the PFD 103 for comparing the feedback clock 102 with the reference clock 101 and generating the control signal based on the result of the comparing.

In block 1220, an output clock is generated based on the control signal in a loop path comprising a plurality of resistive elements and a plurality of capacitive elements. For example, the PLL circuit 200 includes a loop path comprising a plurality of resistive elements and a plurality of capacitive elements respectively distributed in resistor sections and capacitor sections of the charge pump 205, the loop filter 207 and the VCO 209. Furthermore, the resistances of the resistive elements vary in proportion to each other, the capacitances of the capacitive elements vary in proportion to each other, and the damping factor δ of the PLL circuit 200 is maintained substantially constant by using the plurality of resistive elements and the plurality of capacitive elements.

In block 1230, the feedback clock is generated by dividing the output clock by a divider factor. For example, the frequency divider 111 within the PLL circuit 200 generates the feedback clock 102 by dividing the output clock $F_{VCO}$ by the divider factor N.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A phase-locked loop circuit with a loop path, said loop path comprising:
    a charge pump with a charge resistor section for generating a charge pump current;
    a loop filter with a filter resistor section and a filter capacitor section coupled to said charge pump for generating an oscillator control voltage based on said charge pump current; and
    a voltage controlled oscillator with an oscillator resistor section and an oscillator capacitor section coupled to said loop filter for generating an output clock under control of said oscillator control voltage,
    wherein a resistance variation of said filter resistor section is proportional to a resistance variation of said charge resistor section and a resistance variation of said oscillator resistor section, and a capacitance variation of said filter capacitor section is proportional to a capacitance variation of said oscillator capacitor section to maintain a damping factor of said phase-locked loop circuit substantially constant.

2. The phase-locked loop circuit of claim 1, wherein said charge resistor section, said filter resistor section and said oscillator resistor section comprise a plurality of resistive elements of the same type, and said filter capacitor section and said oscillator capacitor section comprise a plurality of capacitive elements of the same type.

3. The phase-locked loop circuit of claim 2, wherein said resistive elements each comprise a switchable resistor array with adjustable resistance.

4. The phase-locked loop circuit of claim 2, wherein said capacitive elements each comprise a switchable capacitor array with adjustable capacitance.

5. The phase-locked loop circuit of claim 1, wherein a RC product of a resistance of said charge resistor section, a resistance of said oscillator resistor section, a capacitance of said filter capacitor section and a capacitance of said oscillator capacitor section is kept constant to maintain a natural frequency of said phase-locked loop circuit substantially constant.

6. The phase-locked loop circuit of claim 5, further comprising:
    a tuning circuit coupled to said loop path for maintaining said natural frequency substantially constant.

7. The phase-locked loop circuit of claim 6, wherein said tuning circuit further comprises:
    a current source with a tuning resistor for generating a tuning current;
    a tuning capacitor charged by said tuning current and generating a tuning voltage; and
    a tuning signal generator coupled to said tuning capacitor for generating a tuning signal based on said tuning voltage.

8. The phase-locked loop circuit of claim 7, wherein said tuning signal is applied to adjust resistances of said tuning resistor, said charge resistor section, said filter resistor section and said oscillator resistor section.

9. The phase-locked loop circuit of claim 7, wherein said tuning signal is applied to adjust capacitances of said tuning capacitor, said filter capacitor section and said oscillator capacitor section.

10. The phase-locked loop circuit of claim 7 wherein said tuning resistor is of the same type as resistive elements in said charge resistor section, said filter resistor section and said oscillator resistor section, and said tuning capacitor is of the same type as capacitive elements in said filter capacitor section and said oscillator capacitor section.

11. The phase-locked loop circuit of claim 7, wherein said tuning signal generator farther comprises:
    a switch coupled in parallel with said tuning capacitor, wherein said tuning capacitor is charged during a predetermined off period of said switch and discharged during an on period of said switch;

a comparator coupled to said tuning capacitor for comparing said tuning voltage with a reference voltage and generating an output signal based on a result of said comparing; and a digital block coupled to said comparator for generating said tuning signal based on a reference clock signal and said output signal, wherein said digital block is farther coupled to said switch for predetermining said off period.

12. The phase-locked loop circuit of claim 11, wherein said predetermined off period is longer than a period used for said tuning voltage to attain said reference voltage.

13. The phase-locked loop circuit of claim 1, wherein said charge pump further compnses a current mirror with a programmable mirror gain, and wherein said programmable mirror gain is predetermined according to said output clock to maintain said damping factor substantially constant when the frequency of said output clock varies.

14. The phase-locked loop circuit of claim 1, wherein said voltage controlled oscillator further comprises a current mirror with a programmable mirror gain, and wherein said programmable mirror gain is predetermined according to said output clock to maintain said damping factor substantially constant when the frequency of said output clock varies.

15. The phase-locked loop circuit of claim 1, wherein said voltage controlled oscillator is a ring oscillator realized by a plurality of inverters coupled in cascade.

16. The phase-locked loop circuit of claim 1, wherein said charge pump further comprises:
    a reference current generator for generating a reference current;
    a current mirror coupled to said reference current generator for generating said charge pump current based on said reference current; and
    a switch device coupled to said current mirror for determining a flowing direction of said charge pump current according to a control signal.

17. The phase-locked loop circuit of claim 1, wherein said voltage controlled oscillator further comprises:
    a current source for generating a plurality of currents;
    a plurality of oscillator capacitors coupled to said current source for generating a plurality of oscillator voltages by selectively charging said plurality of oscillator capacitors with said plurality of currents;
    a comparator coupled to said plurality of oscillator capacitors for comparing said plurality of oscillator voltages with a reference voltage; and
    a flip-flop coupled to said comparator for generating said output clock based on a result of said comparing, wherein said output clock further controls the charging of said plurality of oscillator capacitors.

18. The phase-locked loop circuit of claim 1, wherein said phase-locked loop circuit is selected from the group consisting of: a second order circuit; a third order circuit; and a fourth order circuit.

19. A method for operating a phase-locked loop circuit, comprising:
    comparing a reference clock with a feedback clock and generating a control signal based on a result of said comparing;
    generating an output clock based on said control signal in a loop path comprising a plurality of resistive elements and a plurality of capacitive elements, wherein resistance variations of said resistive elements are proportional to each other, capacitance variations of said capacitive elements are proportional to each other, and a damping factor of said phase-looked loop circuit is maintained substantially constant by using said plurality of resistive elements and said plurality of capacitive elements; and
    generating said feedback clock by dividing said output clock by a divider factor.

20. The method of claim 19, wherein said plurality of resistive elements are of the same type and said plurality of capacitive elements are of the same type.

21. The method of claim 19, further comprising
    adjusting said plurality of resistive elements to maintain a natural frequency of said phase-locked loop circuit substantially constant.

22. The method of claim 19, further comprising
    adjusting said plurality of capacitive elements to maintain a natural frequency of said phase-locked loop circuit substantially constant.

23. The method of claim 19, further comprising:
    generating a tuning current using a tuning resistor;
    charging a tuning capacitor with said tuning current to generate a tuning voltage; and
    generating a tuning signal based on said tuning voltage.

24. The method of claim 23, wherein said tuning resistor is of the same type as said plurality of resistive elements and said tuning capacitor is of the same type as said plurality of capacitive elements.

25. The method of claim 23, further comprising:
    applying said tuning signal to said tuning resistor and said plurality of resistive elements; and
    adjusting said tuning resistor and said plurality of resistive elements according to said tuning signal to cause the resistance of said tuning resistor to vary in inverse proportion to the capacitance of said tuning capacitor such that resistances of said resistive elements vary in inverse proportion to capacitances of said capacitive elements.

26. The method of claim 23, further comprising:
    applying said tuning signal to said tuning capacitor and said plurality of capacitive elements; and
    adjusting said tuning capacitor and said plurality of capacitive elements according to said tuning signal to cause the capacitance of said tuning capacitor to vary in inverse proportion to the resistance of said tuning resistor such that capacitances of said capacitive elements vary in inverse proportion to resistances of said resistive elements.

27. The method of claim 19, further comprising:
    adjusting a mirror gain of said phase-locked loop circuit to maintain said damping factor substantially constant when an output clock of said phase-locked loop circuit varies, wherein said mirror gain is realized between loop currents.

28. The method of claim 27, wherein said mirror gain is adjusted by a digital selection signal that is predetermined according to the frequency of said output clock.

29. A system for operating a phase-locked loop circuit, comprising:
    a frequency phase detector for comparing a reference clock with a feedback clock and generating a control signal based on a result of said comparing;
    a loop path with a plurality of resistive elements and a plurality of capacitive elements coupled to said frequency phase detector for generating an output clock based on said control signal, wherein resistance variations of said resistive elements are proportional to each other, capacitance variations of said capacitive elements are proportional to each other, and a damping factor of said phase-looked loop circuit is maintained substantially constant by using said plurality of resistive elements and said plurality of capacitive elements; and a frequency divider coupled to said loop path for generating said feedback clock by dividing said output clock by a divider factor.

30. The system of claim 29, wherein said plurality of resistive elements are of the same type and said plurality of capacitive elements are of the same type.

31. The system of claim 29, wherein said loop path has a mirror gain realized between loop currents, and wherein said mirror gain is adjusted according to said output clock to maintain said damping factor substantially constant when the frequency of said output clock varies.

32. The system of claim 29, further comprising:

a tuning circuit coupled to said loop path for causing resistances of said resistive elements to vary in inverse proportion to capacitances of said capacitive elements to maintain a natural frequency of said phase-locked circuit substantially constant.

33. The system of claim 32, wherein said tuning circuit comprises a tuning resistor and a tuning capacitor, and wherein said tuning resistor is of the same type with said plurality of resistive elements and said tuning capacitor is of the same type with said plurality of capacitive elements.

34. The phase-locked loop circuit of claim 1, wherein said damping factor of said phase-locked loop circuit is a function of resistance ratios between said charge resistor section, said filter resistor section and said oscillator resistor section and a capacitance ratio between said filter capacitor section and said oscillator capacitor section.

* * * * *